(12) United States Patent
Bour et al.

(10) Patent No.: US 7,374,960 B1
(45) Date of Patent: May 20, 2008

(54) STRESS MEASUREMENT AND STRESS BALANCE IN FILMS

(75) Inventors: David Bour, Cupertino, CA (US); Sandeep Nijhawan, Los Altos, CA (US); Lori D. Washington, Union City, CA (US); Jacob W. Smith, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/508,523

(22) Filed: Aug. 23, 2006

(51) Int. Cl.
*H01L 21/00* (2006.01)

(52) U.S. Cl. .......................... 438/46; 438/47; 438/77; 438/82; 438/99; 257/E21.108; 257/E21.126

(58) Field of Classification Search ................ 438/46, 438/47, 77, 82, 99; 257/E21.108, E21.126, 257/E21.157
See application file for complete search history.

(56) References Cited

U.S. PATENT DOCUMENTS

2007/0240631 A1* 10/2007 Nijhawan et al. ............. 117/98

\* cited by examiner

*Primary Examiner*—Hsien-Ming Lee
(74) *Attorney, Agent, or Firm*—Townsend and Townsend and Crew LLP (57) ABSTRACT

Methods and systems are provided of fabricating a compound nitride semiconductor structure. A substrate is disposed within a processing chamber into which a group-III precursor and a nitrogen precursor are flowed. A layer is deposited over the substrate with a thermal chemical-vapor-deposition process using the precursors. The substrate is transferred to a transfer chamber where a temperature and a curvature of the layer are measured. The substrate is then transferred to a second processing chamber where a second layer is deposited.

17 Claims, 4 Drawing Sheets

Fig. 7

STRESS MEASUREMENT AND STRESS BALANCE IN FILMS

BACKGROUND OF THE INVENTION

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These included the lack of a suitable substrate on which to grow the GaN structures, generally high thermal requirements for growing GaN that resulted in various thermal-convection problems, and a variety of difficulties in efficient p-doping such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metalorganic vapor has been helpful in accommodating the lattice mismatch. Further refinements in the production of Ga—N-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity. In view of these considerations, there is a general need in the art for improved methods and systems for fabricating compound nitride semiconductor devices.

BRIEF SUMMARY OF THE INVENTION

Embodiments of the invention provide methods and systems for fabricating structures. Some embodiments of the invention are specifically directed at fabrication of compound nitride semiconductor structures, but other types of structures may be fabricated in different embodiments.

In a first set of embodiments, methods are provided of fabricating a compound nitride semiconductor structure. A substrate is disposed within a first processing chamber. A first group-III precursor and a first nitrogen precursor are flowed into the first processing chamber. The first group-III precursor comprises a first group-III element. A first layer is deposited over the substrate with a thermal chemical-vapor-deposition process within the first processing chamber using the first group-III precursor and the first nitrogen precursor. The first layer comprises nitrogen and the first group-III element. The substrate is transferred from the first processing chamber to a transfer chamber different from the first processing chamber. A temperature of the first layer is measured within the transfer chamber. A curvature of the first layer is also measured within the transfer chamber. The substrate is transferred to a second processing chamber different from the first processing chamber and different from the transfer chamber. A second layer is deposited over the first layer within the second processing chamber.

In some embodiments, the transfer chamber provides optical access between an interior of the transfer chamber and an exterior of the transfer chamber. In such embodiments, the curvature of the first layer may be measured by directing light to a surface of the first layer and receiving light reflected from the surface. The curvature is then determined from the reflected light. For instance, a plurality of light beams may be directed to the surface of the layer and light spots corresponding to reflections of the light beams from the surface may be received. The curvature is determined from positions of the received light spots.

In some instances, a plurality of temperature measurements of the first layer are obtained over a period of time while the substrate cools in the transfer chamber and plurality of curvature measurements of the first layer are obtained over the period of time. A relationship may then be derived between the measured curvature and the measured temperature over the period of time. This permits determination of a balanced-stress temperature of the first layer at which the first layer is substantially flat. Deposition of the second layer may be performed at substantially this balanced-stress temperature.

The second layer may be deposited by flowing a second group-III precursor and a second nitrogen precursor into the second processing chamber. The second group-III precursor comprises a second group-III element. A thermal chemical-vapor-deposition process is then used within the second processing chamber to deposit the second layer with the second group-III precursor and the second nitrogen precursor. In some cases, the second group-III precursor is not comprised by the first group-III precursor. Deposition of the second layer may be performed at a temperature within the second processing chamber where the first layer is substantially flat.

There are a number of different combinations of materials that may be used. For example, in one embodiment, the first group-III element is gallium, the second group-III element is aluminum, the first layer comprises a GaN layer, and the second layer comprises an AlGaN layer. In another embodiment, the first group-III element is gallium, the second group-III element is indium, the first layer comprises a GaN layer, and the second layer comprises an InGaN layer. In a further embodiment, the first group-III element is gallium, the second group-III element includes aluminum and indium, the first layer comprises a GaN layer, and the second layer comprises an AlInGaN layer.

In a second set of embodiments, a method is provided of fabricating a structure. A first layer is deposited over a substrate within a first processing chamber. The substrate is transferred from the first processing chamber to a transfer chamber different from the first processing chamber. A temperature of the first layer within the transfer chamber is measured, as is a curvature of the first layer. The substrate is transferred to a second processing chamber different from the first processing chamber and different from the transfer chamber. A second layer is deposited over the first layer within the second processing chamber at a temperature at which the first layer is substantially flat.

The transfer chamber may provide optical access between an interior of the transfer chamber and an exterior of the transfer chamber, permitting the curvature of the first layer to be measured by using light reflections as described above. In addition, temperature and curvature measurements may be made over a period of time while the substrate cools in the transfer chamber as described above, permitting derivation of a relationship between the measured curvature and the measured temperature over the period of time.

In a third set of embodiments, a cluster tool is provided. The cluster tool comprises a plurality of processing chambers, each of which includes a substrate holder. A gas-delivery system is configured to introduce gases into the plurality of processing chambers. A pressure-control system maintains selected pressures within the processing chambers. A temperature-control system maintains selected temperatures within the processing chambers. A transfer chamber is interfaced with each of the plurality of processing chambers. The transfer chamber provides optical access between an interior of the transfer chamber and an exterior of the transfer chamber. A robotic transfer system is adapted to transfer substrates between the transfer chamber and each of the plurality of processing chambers. A light source, a light detector, and an optical train are provided. The optical train directs light from the light source through the optical access to a surface of a substrate disposed within the transfer chamber and directs light reflected from the surface to the light detector.

A controller may additionally be provided in communication with the light detector. The controller comprises instructions to determine a curvature of the substrate from respective positions of a plurality of light spots reflected from the surface of the substrate and detected by the light detector.

A temperature monitor may also be disposed within the transfer chamber. In such instances, the controller may have instructions to obtain a plurality of temperature measurements of the substrate over a period of time while the substrate cools in the transfer chamber. A plurality of curvature measurements may similarly be obtained over the period of time. The controller may include instructions to derive a relationship between the curvature and temperature of the substrate over the period of time. Instructions comprised by the controller may determine the balanced-stress temperature at which the substrate is substantially flat from the determined relationship.

The controller may also be in communication with the temperature-control system and the robotic transfer system. In such cases, the controller may have instructions to maintain a temperature in one of the plurality of processing chambers substantially equal to the balanced-stress temperature and to transfer the substrate from the transfer chamber to the one of the processing chambers with the robotic transfer system.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

1. Overview

One of the difficulties mentioned above in fabricating nitride-based structures such as GaN structures is the accommodation of generally high thermal requirements for growth of GaN. Historically, this made the identification of a suitable substrate difficult, with the art more recently focusing on ways in which the use of sapphire $Al_2O_3$ may be accommodated. Sapphire is not an ideal substrate because there is a significant lattice mismatch with deposited nitride layers; in the specific case of GaN, this lattice mismatch is approximately 15%. While the use of a nitride buffer layer has been helpful in accommodating the lattice mismatch, both the lattice mismatch and other physical differences between the sapphire substrate and overlying nitride layer result in distortions of resulting structures.

Figure 1:
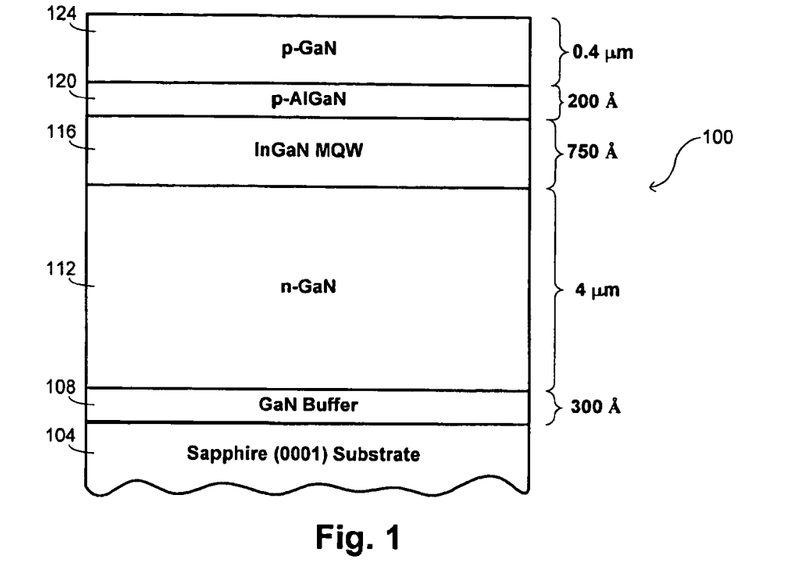
FIG. 1 provides a schematic illustration of a GaN-based LED.

One typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer.

A typical fabrication process for such an LED may use a metalorganic chemical-vapor-deposition ("MOCVD") process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and N precursors, perhaps with a flow of a fluent gas like $N_2$, $H_2$, and/or $NH_3$; an InGaN layer may be deposited using Ga, N, and In precursors, perhaps with a flow of a fluent gas; and an AlGaN layer may be deposited using Ga, N, and Al precursors, also perhaps with a flow of a fluent gas. In the illustrated structure 100, the GaN buffer layer 108 has a thickness of about 300 Å, and may have been deposited at a temperature of about 550° C. Subsequent deposition of the n-GaN layer 112 is typically performed at a higher temperature, such as around 1050° C. in one embodiment. The n-GaN layer 112 is relatively thick, with deposition of a thickness on the order of 4 μm requiring about 140 minutes. The InGaN multi-quantum-well layer 116 may have a thickness of about 750 Å, which may be deposited over a period of about 40 minutes at a temperature of about 750° C. The p-AlGaN layer 120 may have a thickness of about 200 Å, which may be deposited in about five minutes at a temperature of 950° C. The thickness of the contact layer 124 that completes the structure may be about 0.4 μm in one embodiment, and may be deposited at a temperature of about 1050° C. for around 25 minutes.

Figure 2A:
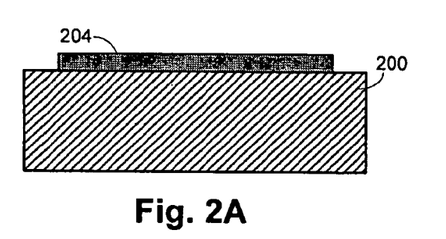
FIGS. 2A and 2B illustrate how physical differences between a substrate and material deposited on a substrate may result in shape distortions of nitride-based structures.
Figure 2B:
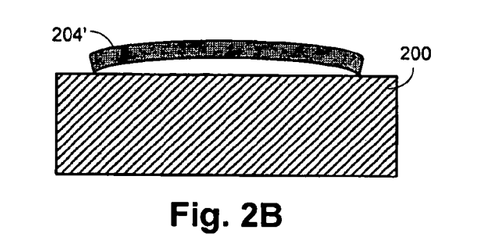

An illustration of the type of shape distortion that may result from such a deposition process is illustrated schematically with FIGS. 2A and 2B. As illustrated with the description of the structure shown in FIG. 1, fabrication processes of nitride structures may include a number of temperature changes and consistently take place at temperatures elevated from normal operational temperatures of the completed structures. In addition to there being a lattice mismatch between sapphire and GaN, such materials have different coefficients of thermal expansion, causing differences in thermal expansion at different processing temperatures. This effect is generally even more significant than the lattice mismatch in causing shape distortions. The effect is illustrated schematically in FIGS. 2A and 2B. In these drawings, element 200 is a substrate holder, over which the structure 204 being fabricated is disposed. The two drawings are at different points in time during a fabrication process, with FIG. 2B corresponding to a later time than FIG. 2A and at a lower temperature than FIG. 2A. Such a sequence may occur in a variety of different fabrication processes for nitride structures. In the specific case of the structure shown in FIG. 1, for example, FIG. 2A may correspond to a point in time during epitaxy of the n-GaN layer 112 when the temperature is about 1050° C. and FIG. 2B may correspond to a point in time during growth of the InGaN active region 116 when the temperature is about 750° C. Notably, FIG. 2B could also correspond to a point in time after the entire structure has been fabricated and cooled down to room temperature.

It is evident from the drawing that the structure 204' at the cooler temperature is deformed with a center that is bowed upwards when compared with the structure 204 at the higher temperature. This bowing results from the differential thermal expansion between GaN and sapphire. Deposition may occur with a flat geometry at the temperatures used for GaN growth as shown in FIG. 2A. But when the structure is subsequently cooled for deposition of the InGaN active region, the substrate center bows upwards and becomes somewhat cooler than the edges. This temperature nonuniformity over the surface of the structure results in a nonuniformity in indium distribution in the deposited InGaN, with indium-rich regions tending to form at the center of the substrate and indium-poor regions tending to form at the periphery of the substrate. In turn, this nonuniformity in indium distribution translates into wavelength and light-output variations for devices formed across the structure, limiting the scale-up of the process for producing these materials.

Embodiments of the invention provide methods and systems that permit monitoring of the stress characteristics of a substrate to determine a "stress fingerprint" that relates stress in the substrate to a processing parameter such as temperature. In some instances, a surrogate for the stress is used in defining the stress fingerprint, such as in embodiments where a curvature of the substrate is used as a proxy for the stress. Generally, stress in a substrate or film is manifested by some curvature in the substrate or film, with compressive stress causing the substrate or film to be bowed in a concave fashion and tensile stress causing the substrate or film to have a convex bow like that illustrated in FIG. 2B.

The stress fingerprint may be used to determine processing conditions under which further processing of the substrate may be performed while the substrate is substantially relaxed, i.e. is substantially flat. This may be particularly relevant during deposition of the active layer 116 of an LED. The emission wavelength of the LED has a strong dependence on temperature and variations in temperature across a substrate that result from curvature may be manifested by nonuniformities in emission wavelengths of the resultant LEDs. By using the stress fingerprint to provide a substantially flat substrate during deposition of the active layer, considerably greater uniformity in emission wavelengths may be realized.

2. Exemplary Substrate Processing System

Figure 3:
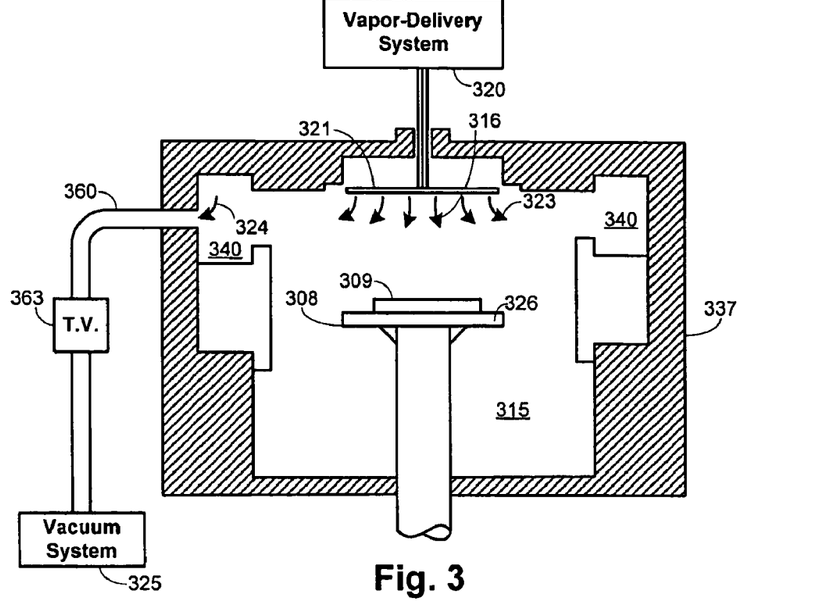
FIG. 3 is a simplified representation of an exemplary CVD apparatus that may be used in implementing certain embodiments of the invention.

FIG. 3 is a simplified diagram of an exemplary chemical vapor deposition ("CVD") system, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 315 that receives process and other gases from a gas or vapor delivery system 320, a vacuum system 325, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 337 that forms vacuum chamber 315 with a gas reaction area 316. A gas distribution structure 321 disperses reactive gases and other gases, such as purge gases, toward one or more substrates 309 held in position by a substrate support structure 308. Between gas distribution structure 321 and the substrate 309 is gas reaction area 316. Heaters 326 can be controllably moved between different positions to accommodate different deposition processes as well as for an etch or cleaning process. A center board (not shown) includes sensors for providing information on the position of the substrate.

Different structures may be used for heaters 326. For instance, some embodiments of the invention advantageously use a pair of plates in close proximity and disposed on opposite sides of the substrate support structure 308 to provide separate heating sources for the opposite sides of one or more substrates 309. Merely by way of example, the plates may comprise graphite or SiC in certain specific embodiments. In another instance, the heaters 326 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 326 exposed to vacuum chamber 315 are made of a ceramic material, such as aluminum oxide ($Al_2O_3$ or alumina) or aluminum nitride. In another embodiment, the heaters 326 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from the gas or vapor delivery system 320 through supply lines to the gas distribution structure 321. In some instances; the supply lines may deliver gases into a gas mixing box to mix the gases before delivery to the gas distribution structure. In other instances, the supply lines may deliver gases to the gas distribution structure separately, such as in certain showerhead configurations described below. The gas or vapor delivery system 320 includes a variety of sources and appropriate supply lines to deliver a selected amount of each source to chamber 315 as would be understood by a person of skill in the art. Generally, supply lines for each of the sources include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid or solid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the gas distribution structure 321 is vented toward the substrate surface (as indicated by arrows 323), where it may be uniformly distributed radially across the substrate surface in a laminar flow.

Purging gas may be delivered into the vacuum chamber 315 from gas distribution structure 321 and/or from inlet ports or tubes (not shown) through the bottom wall of enclosure assembly 337. Purge gas introduced from the bottom of chamber 315 flows upward from the inlet port past the heater 326 and to an annular pumping channel 340. Vacuum system 325 which includes a vacuum pump (not shown), exhausts the gas (as indicated by arrows 324) through an exhaust line 360. The rate at which exhaust gases and entrained particles are drawn from the annular pumping channel 340 through the exhaust line 360 is controlled by a throttle valve system 363.

The temperature of the walls of deposition chamber 315 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Gas distribution manifold 321 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 320.

Figure 4:
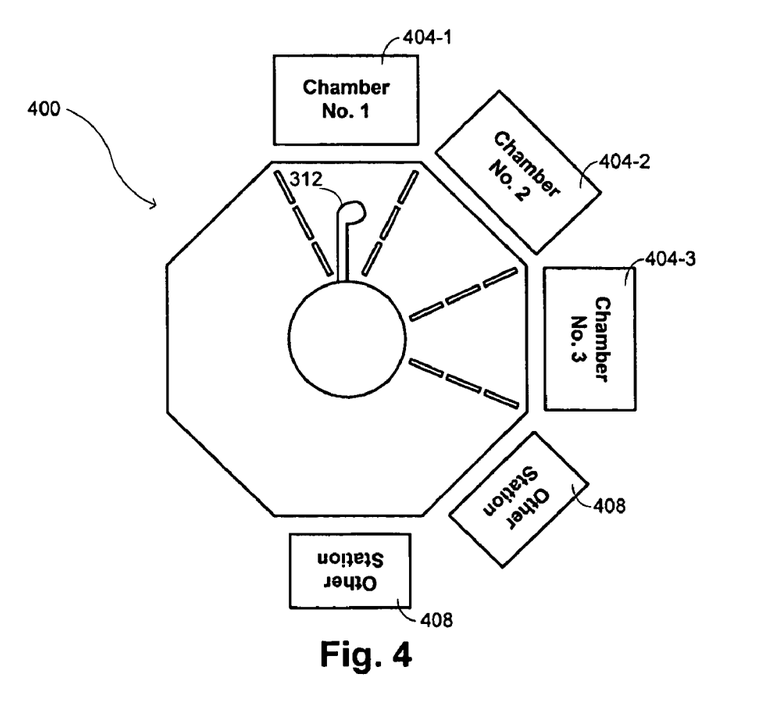
FIG. 4 provides a schematic illustration of a multichamber cluster tool used in embodiments of the invention.

The physical structure of the cluster tool is illustrated schematically in FIG. 4. In this illustration, the cluster tool 400 includes three processing chambers 404 and two additional stations 408, with robotics 412 adapted to effect transfers of substrates between the chambers 404 and stations 408. The structure permits the transfers to be effected in a defined ambient environment, including under vacuum, in the presence of a selected gas, under defined temperature conditions, and the like. Optical access is provided to a transfer chamber in which the transfers are effected through a window 410. A particular advantage of having optical access provided through the transfer chamber, as opposed to through one of the processing chambers 404, is that the window 410 may be made relatively large. A concern with providing optical access to processing chambers is the disturbance that a window or similar structure will have on processing characteristics taking place within the chamber. Since no processing takes place directly on the substrate in the transfer chamber, such concerns are avoided. A variety of optical elements may be included within or outside the transfer chamber to direct the light as desired.

3. Stress Measurement and Balance

In embodiments of the invention, stress measurements are made during a transfer between processing chambers as part of a multichamber deposition process. An illustration of the basic technique by which stress measurements may be made is illustrated with FIG. 5. Curvature of a substrate 516 is used as a proxy for stress, with the substrate 516 being provided over a substrate holder 520 using a configuration like that described in connection with FIG. 3. An array of light spots are directed to the surface of the substrate 516, with FIG. 4 showing a light source 508 used to generate a plurality of light beams 524 that are focused by an optical arrangement 512 onto the substrate 516 surface. In this example, the optical arrangement 512 comprises a prism that permits collection of light reflected from the substrate 516 surface to be collected by a light detector 504, but other optical arrangements may be used in various alternative embodiments. The light beams 524 may preferably be provided as highly collimated beams, such as may be generated with a variety of laser systems known to those of skill in the art. Different types of light detectors may be used in different embodiments. The relatively large optical access permitted with the transfer chamber enables effective use of such structures as charge-coupled devices to be used as the light detector, although other embodiments may use position-sensitive detectors as described in detail in copending, commonly assigned U.S. patent application Ser. No. 11/678, 870, entitled "STRESS MEASUREMENTS DURING LARGE-MISMATCH EPITAXIAL PROCESSES," filed by David Bour and Jacob Smith, the entire disclosure of which is incorporated herein by reference for all purposes.

Figure 5:
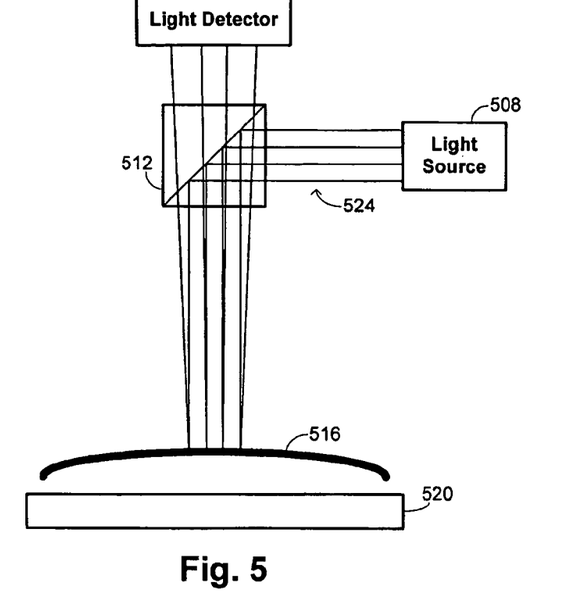
FIG. 5 is a schematic illustration of techniques used for measuring stress in a substrate during processing.

The manner in which light is detected by the detector 504 depends on the direction of the light comprised by the reflected spots. Reflected spots that are moved away from each other relative to the incident pattern indicate that the surface is convex, with the degree of curvature being indicated by how far the reflected spots are moved from the incident pattern. Conversely, reflected spots that are moved towards each other relative to the incident pattern indicate that the surface is concave, with the degree of curvature again being indicated by how far the reflected spots are moved from the incident pattern. The light detector 504 may be provided in communication with a computational unit that includes programming to correlate differences between the incident and reflected spot patterns with the degree of curvature.

Figure 6:
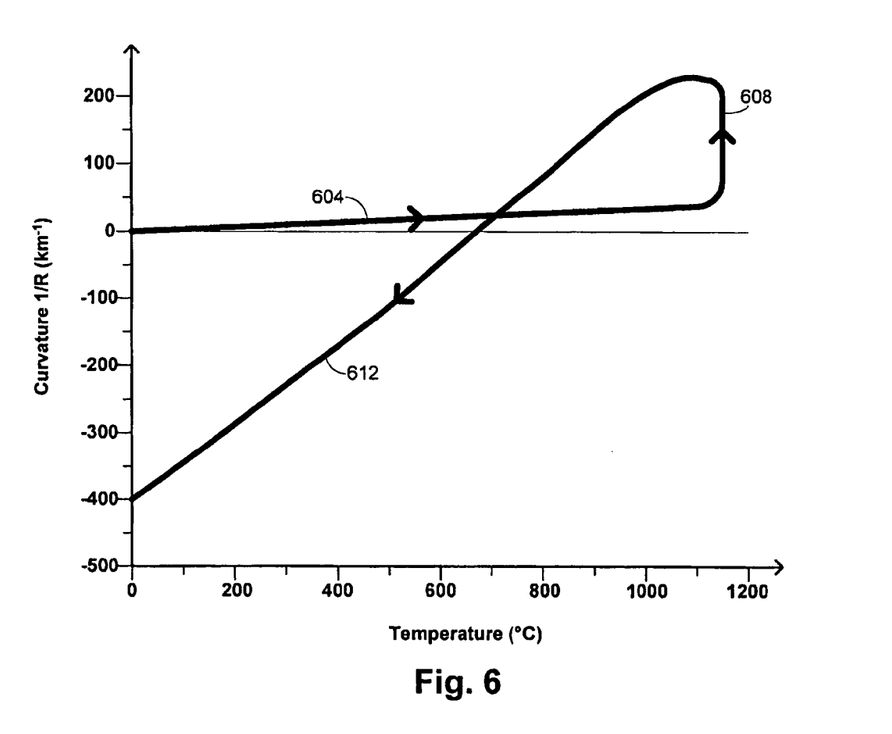
FIG. 6 is a plot that illustrates features of a stress fingerprint determined in embodiments of the invention.

The evolution of stress in the substrate during processing is shown schematically in FIG. 6. Biaxial tension produces a positive curvature that corresponds to a concave structure while compression produces a negative curvature that corresponds to a convex structure. A substrate that begins flat typically develops a slight concave curvature during heatup, as indicated by part 604 of the curve in FIG. 6. During this stage, the curvature is due to the temperature gradient across the thickness of the substrate, with portions of the substrate in contact with a susceptor being at a higher temperature than top portions of the substrate. The presence or not of a thin nucleation layer, like buffer layer 108 in FIG. 1 is negligible because such a layer is typically very thin and discontinuous at high temperature, when it coalesces into crystalline islands.

When a thick layer is subsequently grown, such as the thick GaN layer 112 shown in FIG. 1, tensile strain increases as a result of the residual, unrelaxed lattice mismatch between the layer and the substrate. This is shown with part 608 of the curve in FIG. 6, with the tensile strain being distributed throughout the entire structure. The resultant concavity may thus depend on the thickness of the layer that is deposited and on the thickness of the underlying substrate (perhaps including any overlying nucleation or other layers). When the structure is subsequently cooled, as indicated by part 612 of the curve in FIG. 6, the thermal-expansion mismatch between the thick layer and the substrate produces a compressive strain. When fully cooled to room temperature, this thermal mismatch dominates the net strain so that the structure exhibits a fairly severe convex curvature.

At some temperature intermediate between room temperature and the temperature used for bulk growth, the intrinsic tensile strain is perfectly balanced by the thermal-expansion mismatch so that the net stress vanishes and the structure resumes the originally flat state of the initial substrate. For example, in the illustration provided in FIG. 6, this balanced-stress temperature occurs at about 700° C. There are various instances in which it is desirable that the temperature of one or more subsequent processes be the temperature at which the two forms of stress are perfectly balanced. This is the case, for example, when fabricating a structure like that shown in FIG. 1. As explained above, fabrication of this layer is preferably performed in a relaxed state because the presence of curvature causes there to be temperature nonuniformities during growth that are ultimately manifested as wavelength variations among completed LEDs.

There are a number of ways in which the stress-balance temperature may be manipulated. In the particular case of nitride structures like those shown in FIG. 1, the amount of tensile strain in the thick GaN layer 112 may be beneficially affected by the nucleation procedure that produces the buffer layer 108. This procedure impacts the dislocation density and incomplete relaxation of the GaN film 112 through dislocation formation. The amount of tensile strain may be increased by depositing AlGaN alloys, or with heavy silicon doping. Alternatively, the tensile strain may be reduced with InGaN alloys, or by depositing low-temperature AlN interlayers. These types of techniques permit the tensile strain to be engineered, thereby permitting the stress-balance temperature to be controlled and adjusted to the active-layer 116 growth temperature.

Curvature measurements made in the transfer chamber of a cluster tool permit mapping the curvature as a function of temperature during cooldown. This mapping may be over a temperature range from about room temperature to the transfer temperature, and therefore includes a portion of part 612 of the curve in FIG. 6. The transfer temperature may vary depending on specifics of the process being performed; when a structure like the LED of FIG. 1 is being fabricated and transfer occurs after deposition of the thick GaN layer 112, the transfer temperature is typically between 500 and 1000° C. The derived portion of part 612 of the curve acts as the stress fingerprint, and may serve as a component of the routine characterization used to evaluate run-to-run or substrate-to-substrate reproducibility.

Furthermore, this curvature characteristic may be projected back to find the stress-balance temperature where the curvature is substantially zero. When fabricating structures like the LED of FIG. 1, it may thus be used to determine the state of curvature that was present during growth of the active layer 116, permitting modifications to be made to the bulk structure to modify the state of curvature as desired.

Figure 7:
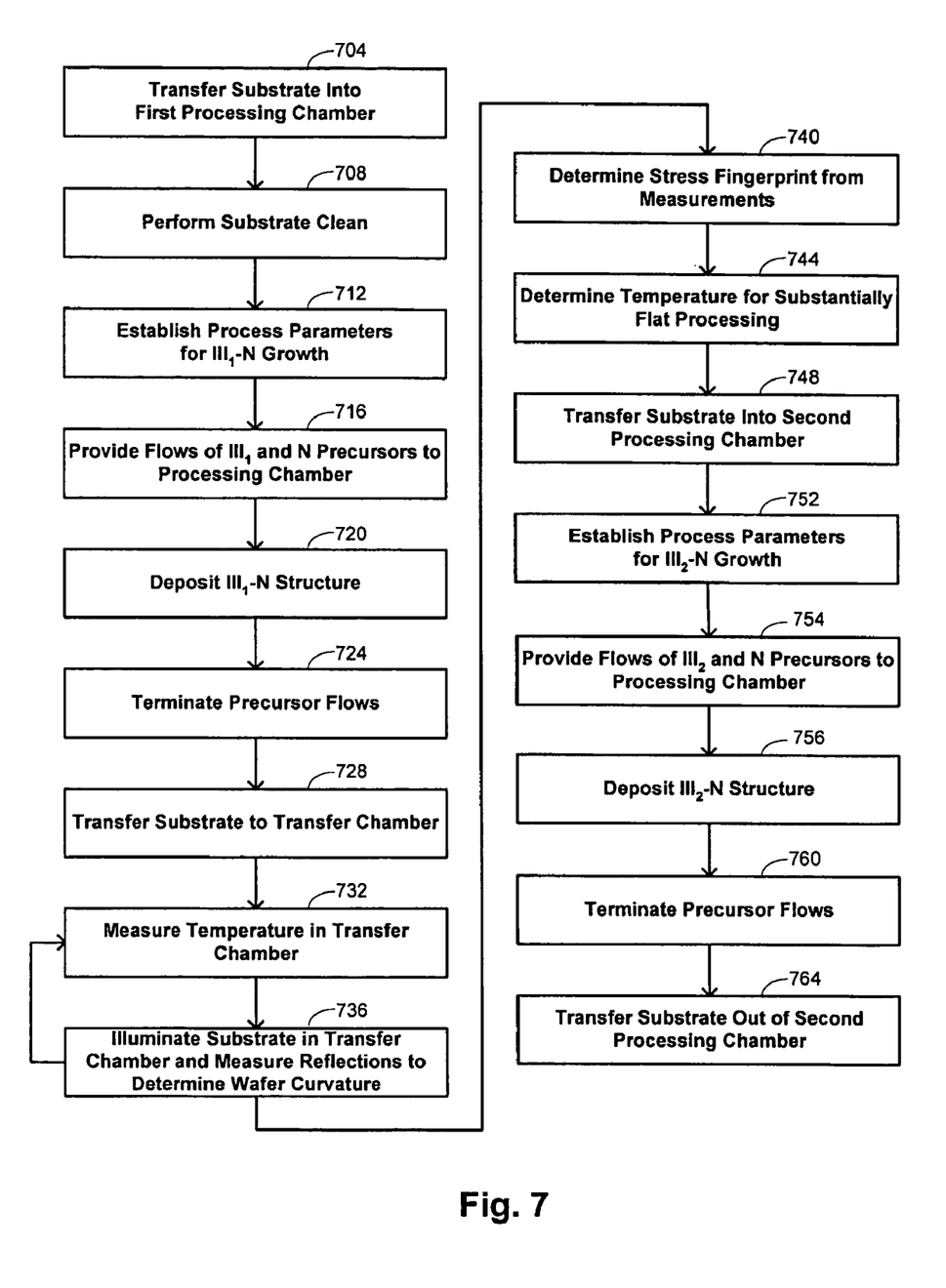
FIG. 7 is a flow diagram that summarizes certain processes that may be performed in embodiments of the invention.

An illustration of a cluster-tool process that may be implemented according to embodiments of the invention is provided with the flow diagram of FIG. 7. Implementation of this process is suitable for fabrication of the LED structure shown in FIG. 1 as well as for other types of nitride structures. While this specific illustration focuses on processes for fabricating nitride structures, it will be evident to those of skill in the art that the processes may be readily adapted to other multichamber processes, such as may be performed in silicon processing or in processes involving other materials.

The illustrated process begins at block 704 by using the robotics 412 of the cluster tool to transfer a substrate into a first of the processing chambers 404-1. For deposition of a nitride structure, the substrate may comprise sapphire, although other materials that may be used include SiC, Si, spinel, lithium gallate, ZnO, and others. The substrate is cleaned in the first processing chamber 404-1 at block 708, after which process parameters suitable for growth of a $III_1$-N layer may be established at block 712. Such process parameters may include temperature, pressure, and the like to define an environment within the first processing chamber 404-1 appropriate for thermal deposition of a nitride layer. Flows of precursors are provided at block 716 to deposit the $III_1$-N layer over the substrate at block 720. The precursors include a nitrogen source and a source for a first group-III element such as Ga. For instance, suitable nitrogen precursors include $NH_3$ and suitable Ga precursors include trimethyl gallium ("TMG"). The first group-III element may sometimes comprise a plurality of distinct group-III elements such as Al and Ga, in which case a suitable Al precursor may be trimethyl aluminum ("TMA"); in another example, the plurality of distinct group-III elements includes In and Ga, in which case a suitable In precursor may be trimethyl indium ("TMI"). A flow of a carrier gas such as $N_2$ and/or $H_2$ may also be included.

After deposition of the $III_1$-N structure at block 720, the precursor flows are terminated at block 724. In some instances, additional processing may be performed on the structure by performing further deposition or etching steps, after which the substrate is transferred by the robotics 412 out of the first processing chamber 404-1 and into a transfer chamber.

While in the transfer chamber, measurements are made to determine the stress fingerprint as the structure cools. At block 732, the temperature of the structure is measured and at block 736, the wafer curvature is determined. These measurements may be repeated multiple times as the structure cools in mapping out the temperature dependence of the curvature. A determination of the curvature may be made at block 736 by illuminating a surface of the structure with a plurality of light spots. This permits relative positions of reflections of the light spots to be used in quantifying curvature as described above. The set of combinations of temperature and curvature measurements made at blocks 732 and 736 thus define a portion of the characteristic curve of FIG. 6. There are a variety of different environments that may be present in the transfer chamber in different embodiments, including a high-purity $N_2$ environment, a high-purity $H_2$ environment, or a high-purity $NH_3$ environment.

Block 744 indicates that the temperature for substantially flat processing of the structure is determined. This is done by extrapolating or interpolating the results for the stress fingerprint depending on the temperature range over which it was determined. It is generally expected that the relationship between curvature 1/R and temperature will be approximately linear, in which case the interpolation or extrapolation is straightforward. In other instances, more sophisticated interpolation or extrapolation algorithms may be used to account for nonlinearities in the stress fingerprint. Merely by way of example, some algorithms that might be used in different embodiments include a variety of nonlinear regression algorithms, polynomial fitting algorithms, cubic spline fitting algorithms, and the like.

There are also different ways in which the determination may be used. In some instances, the information may be used directly in the subsequent phase of the processing described below in assigning a temperature for growing a $III_2$-N structure. This might be the case, for example, where a process recipe provides a temperature range for fabrication of the active layer, say 700-750° C. The determination at block 744 could then be used to determine where in this temperature range to fabricate the active layer, resulting in the fabrication of LEDs with more uniform wavelength properties that still conform to a defined tolerance. In other instances, the determination at block 744 could be used as a quality-control feature. For example, a process recipe could require that fabrication of the active layer be performed at a specified temperature. The determination at block 744 could be used to ascertain whether the curvature at that temperature is so severe that the wavelength nonuniformity will be unacceptable. This permits rejection of the structure to be made earlier in the process. In still other instances, the determination at block 744 could be used for refinement of a recipe. While a current recipe may be completed, modifications to bring the stress-balance temperature closer to the active-layer fabrication temperature could be made. Similarly, the determination at block 744 might be used in evaluating the success of such modifications, permitting further adjustments to be made to the recipe.

At block 748, further processing of the structure begins by using the robotics 412 of the cluster tool to transfer the substrate into a second of the plurality of processing chambers 404-2. Deposition of the $III_2$-N layer is performed by establishing suitable processing parameters such as temperature, pressure, and the like for such deposition at block 752. Flows of precursor gases are provided at block 754 to enable the $III_2$-N structure to be deposited at block 756. This structure may sometimes include a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required by the invention and the $III_2$ layer may more generally include such other compositions as quaternary AlInGaN layers. Similarly, in the case where the $III_1$-N layer is AlGaN, the $III_2$-N layer may be an InGaN layer on an AlInGaN layer. Suitable precursors for deposition of the $III_2$-N layer may be similar to the precursors used for the $III_1$ layer, i.e. $NH_3$ is a suitable nitrogen precursor, TMG is a suitable gallium precursor, TMA is a suitable aluminum precursor, and TMI is a suitable indium precursor. A carrier case such a $N_2$ and/or $H_2$ may also be included. After deposition of the $III_2$-N structure, the precursor flows are terminated at block 760.

Similar to the deposition of the III'-N structure, some additional processing may be performed on the deposited $III_2$-N structure with deposition and/or etching. When the processing in the second chamber 404-2 is completed, the substrate is transferred out of the chamber at block 764. In some instances, processing may be completed in two chambers so that the structure is complete at block 764. In other instances, the transfer out of the second chamber at block 764 may instead be followed by a transfer into another chamber, either into the first chamber for further III'-N processing or into yet a third chamber for $III_3$-N processing. A sequence of transfers among the different chambers may be performed as appropriate for fabrication of the specific device, thereby exploiting the particular process windows enabled by the different chambers. The invention is not limited by any particular number of processing chambers that may be used in a particular fabrication process nor by any particular number of times processes are performed in any the individual chambers of the cluster tool.

In various of these embodiments, additional stress fingerprints may be determined from measurements of temperature and curvature while the structure is in the transfer chamber. The results of such determinations may be put to similar uses as described above—namely, to using the results in determining process parameters for a later step in the overall fabrication process, as a quality-control mechanism, to determine modifications to a process recipe, and the like.

Merely by way of example, one of the processing chambers may be configured to enhance the deposition rate of GaN deposition and a second of the processing chambers may be configured to enhance the uniformity of deposition. In many structures, the total processing time may be highly dependent on the deposition rate of GaN because it provides the thickest layer in the completed structure. Having a first chamber optimized to increase GaN growth thus significantly improves overall tool productivity. At the same time, the hardware characteristics that permit fast growth of GaN may be relatively poorly suited for growth of InGaN quantum wells, which often provide the active emission centers. Growth of such structures generally requires greater uniformity characteristics, which are manifested by improved wavelength uniformity in the luminescent structures that are produced. Optimization of precursor distribution to improve wafer uniformity may be at the expense of growth rate. Having a second processing chamber optimized to provide highly uniform deposition for InGaN multi-quantum-well structures thus permits the uniformity objectives to be achieved without greatly compromising the overall processing time for the entire structure. Further details of the use of multichamber structures for nitride processing are provided in copending, commonly assigned U.S. patent application Ser. No. 11/404,516, entitled "EPITAXIAL GROWTH OF COMPOUND NITRIDE SEMICONDUCTOR STRUCTURES," filed Apr. 14, 2006 by Sandeep Nijhawan et al., the entire disclosure of which is incorporated herein by reference for all purposes.

In general, the processing conditions used for deposition of a III-N layer may vary depending on specific applications. The following table provides exemplary processing conditions and precursor flow rates that are generally suitable in the growth of nitride semiconductor structures using the methods and systems described above:

| Parameter | Value |
| --- | --- |
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

The table also notes that group-V precursors different from nitrogen may also sometimes be included. For example, a III'-N—P structure may be fabricated by including a flow of phosphine $PH_3$ or a III-N—As structure may be fabricated by including a flow of arsine $AsH_3$. The relative stoichiometry of the nitrogen to the other group-V element in the structure may be determined by suitable choices of relative flow rates of the respective precursors. In still other instances, doped compound nitride structures may be formed by including dopant precursors, particular examples of which include the use of rare-earth dopants.

Thus, having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method of fabricating a compound nitride semiconductor structure, the method comprising:
   disposing a substrate within a first processing chamber;
   flowing a first group-III precursor and a first nitrogen precursor into the first processing chamber, the first group-III precursor comprising a first group-III element;
   depositing a first layer over the substrate with a thermal chemical-vapor-deposition process within the first processing chamber using the first group-III precursor and the first nitrogen precursor, the first layer comprising nitrogen and the first group-III element;
   transferring the substrate from the first processing chamber to a transfer chamber different from the first processing chamber;
   measuring a temperature of the first layer within the transfer chamber;
   measuring a curvature of the first layer within the transfer chamber;
   transferring the substrate to a second processing chamber different from the first processing chamber and different from the transfer chamber; and
   depositing a second layer over the first layer within the second processing chamber.

2. The method recited in claim 1 wherein:
   the transfer chamber provides optical access between an interior of the transfer chamber and an exterior of the transfer chamber; and
   measuring the curvature of the first layer comprises:
   directing light to a surface of the first layer;
   receiving light reflected from the surface; and
   determining the curvature from the reflected light.

3. The method recited in claim 2 wherein:
   directing light to the surface of the first layer comprises directing a plurality of light beams to the surface of the layer;
   receiving light reflected from the surface comprises receiving light spots corresponding to reflections of the light beams from the surface; and
   determining the curvature from the reflected light comprises determining the curvature from positions of the received light spots.

4. The method recited in claim 1 wherein:
   measuring the temperature of the first layer comprises obtaining a plurality of temperature measurements of the first layer over a period of time while the substrate cools in the transfer chamber; and
   measuring the curvature of the first layer comprises obtaining a plurality of curvature measurements of the first layer over the period of time,
   the method further comprising deriving a relationship between the measured curvature and the measured temperature over the period of time.

5. The method recited in claim 4 further comprising determining a balanced-stress temperature of the first layer at which the first layer is substantially flat from the derived relationship.

6. The method recited in claim 5 wherein depositing the second layer is performed at substantially the balanced-stress temperature.

7. The method recited in claim 1 wherein depositing the second layer comprises:
flowing a second group-III precursor and a second nitrogen precursor into the second processing chamber, the second group-III precursor comprising a second group-III element; and
depositing the second layer over the first layer with a thermal chemical-vapor-deposition process within the second processing chamber using the second group-III precursor and the second nitrogen precursor.

8. The method recited in claim 7 wherein the second group-III precursor is not comprised by the first group-III precursor.

9. The method recited in claim 8 wherein depositing the second layer is performed at a temperature within the second processing chamber where the first layer is substantially flat.

10. The method recited in claim 9 wherein:
the first group-III element is gallium;
the second group-III element is aluminum;
the first layer comprises a GaN layer; and
the second layer comprises an AlGaN layer.

11. The method recited in claim 9 wherein:
the first group-III element is gallium;
the second group-III element is indium;
the first layer comprises a GaN layer; and
the second layer comprises an InGaN layer.

12. The method recited in claim 9 wherein:
the first group-III element is gallium;
the second group-III element includes aluminum and indium;
the first layer comprises a GaN layer; and
the second layer comprises an AlInGaN layer.

13. A method of fabricating a structure, the method comprising:
depositing a first layer over a substrate within a first processing chamber;
transferring the substrate from the first processing chamber to a transfer chamber different from the first processing chamber;
measuring a temperature of the first layer within the transfer chamber;
measuring a curvature of the first layer within the transfer chamber;
transferring the substrate to a second processing chamber different from the first processing chamber and different from the transfer chamber; and
depositing a second layer over the first layer within the second processing chamber at a temperature at which the first layer is substantially flat.

14. The method recited in claim 13 wherein:
the transfer chamber provides optical access between an interior of the transfer chamber and an exterior of the transfer chamber; and
measuring the curvature of the first layer comprises:
directing light to a surface of the first layer;
receiving light reflected from the surface; and
determining the curvature from the reflected light.

15. The method recited in claim 14 wherein:
directing light to the surface of the first layer comprises directing a plurality of light beams to the surface of the layer;
receiving light reflected from the surface comprises receiving light spots corresponding to reflections of the light beams from the surface; and
determining the curvature from the reflected light comprises determining the curvature from positions of the received light spots.

16. The method recited in claim 13 wherein:
measuring the temperature of the first layer comprises obtaining a plurality of temperature measurements of the first layer over a period of time while the substrate cools in the transfer chamber; and
measuring the curvature of the first layer comprises obtaining a plurality of curvature measurements of the first layer over the period of time,
the method further comprising deriving a relationship between the measured curvature and the measured temperature over the period of time.

17. The method recited in claim 16 further comprising determining the temperature at which the first layer is substantially flat from the derived relationship.

* * * * *

UNITED STATES PATENT AND TRADEMARK OFFICE
CERTIFICATE OF CORRECTION

PATENT NO. : 7,374,960 B1
APPLICATION NO. : 11/508523
DATED : May 20, 2008
INVENTOR(S) : Bour et al.

Page 1 of 1

It is certified that error appears in the above-identified patent and that said Letters Patent is hereby corrected as shown below:

Column 7, line 23, delete "instances; the", and insert --instances, the--;
Column 12, line 29, delete "III'-N", and insert --III$_1$-N--;
Column 12, line 40, delete "III'-N", and insert --III$_1$-N--;
Column 13, line 64, delete "III'-N—P", and insert --III-N-P--; and
Column 13, line 64, delete "III-N—As", and insert --III-N-As--.

Signed and Sealed this

Second Day of September, 2008

JON W. DUDAS
*Director of the United States Patent and Trademark Office*